United States Patent
Hirsh et al.

(10) Patent No.: US 10,848,139 B2
(45) Date of Patent: Nov. 24, 2020

(54) METHOD AND APPARATUS FOR PREDICTING FAILURES IN DIRECT CURRENT CIRCUITS

(71) Applicant: SMARTKABLE LLC, Skaneateles, NY (US)

(72) Inventors: Douglas S. Hirsh, Skaneateles, NY (US); Michael Muehlemann, Liverpool, NY (US); Radovan Hrinda, Clark, NJ (US)

(73) Assignee: SMARTKABLE, LLC, Skaneateles, NY (US)

( * ) Notice: Subject to any disclaimer, the term of this patent is extended or adjusted under 35 U.S.C. 154(b) by 0 days.

(21) Appl. No.: 16/461,091

(22) PCT Filed: Nov. 16, 2017

(86) PCT No.: PCT/US2017/061957
§ 371 (c)(1),
(2) Date: May 15, 2019

(87) PCT Pub. No.: WO2018/094006
PCT Pub. Date: May 24, 2018

(65) Prior Publication Data
US 2020/0059225 A1 Feb. 20, 2020

Related U.S. Application Data

(60) Provisional application No. 62/422,762, filed on Nov. 16, 2016.

(51) Int. Cl.
*H03K 5/1536* (2006.01)
*G05B 23/02* (2006.01)

(52) U.S. Cl.
CPC ....... *H03K 5/1536* (2013.01); *G05B 23/0283* (2013.01)

(58) Field of Classification Search
None
See application file for complete search history.

(56) References Cited

U.S. PATENT DOCUMENTS 5,625,539 A * 4/1997 Nakata ................ H02M 7/4807
363/132
6,249,137 B1 6/2001 Krieger et al.
(Continued)

FOREIGN PATENT DOCUMENTS

| EP | 0 480 726 | 4/1992 |
| EP | 1 398 639 | 3/2004 |
| EP | 2 051 366 | 4/2009 |

*Primary Examiner* — Lincoln D Donovan
*Assistant Examiner* — Khareem E Almo
(74) *Attorney, Agent, or Firm* — Clark & Brody LP

(57) ABSTRACT

A method of monitoring the condition of a circuit comprises establishing a known baseline signal for a type of circuit (each is somewhat different) and defining these characteristics in terms of the lead and trailing edge angular components (@ zero crossing point), the voltage (amplitude), and the period (time length) of the waveform. Ideally, the angular component of the square wave should be vertical, or at 90 degrees to x-axis. The baseline non-regular square wave that is composed of current, voltage, any harmonic thereof, or the combination of these signals which best indicate predictive measurement attributed to the type of circuit being monitored. Future wave forms indicate the rate of decay based upon the aggregated angular, amplitude, and period components of the zero-crossing points when compared to the baseline signal and/or prior waveform of the observed specific splice. The rate of decay can help determine the life expectancy of the circuit.

5 Claims, 5 Drawing Sheets

(56) References Cited

U.S. PATENT DOCUMENTS

| | | |
|---|---|---|
| 7,956,617 B1 | 6/2011 | McCarthy et al. |
| 2006/0259271 A1* | 11/2006 | House ................ G05B 23/0283 702/181 |
| 2007/0075792 A1 | 4/2007 | Liu |
| 2008/0015795 A1 | 1/2008 | Hofmeister et al. |
| 2009/0167336 A1 | 7/2009 | La Rosa et al. |
| 2011/0125419 A1 | 5/2011 | Bechhoefer et al. |
| 2013/0120009 A1 | 5/2013 | Laplanche |
| 2014/0239972 A1 | 8/2014 | Hirsh et al. |
| 2016/0084896 A1 | 3/2016 | Jungwirth et al. |
| 2016/0216315 A1 | 7/2016 | Jung |
| 2020/0059225 A1* | 2/2020 | Hirsh ................... H03K 5/1536 |

\* cited by examiner

METHOD AND APPARATUS FOR PREDICTING FAILURES IN DIRECT CURRENT CIRCUITS

FIELD OF INVENTION

The present invention relates to any DC circuit that can pass an electrical current through, verified, and analyzed using such techniques and monitoring attributes of degradation to predict future failure terms of the circuit.

BACKGROUND ART

Typical electrical circuits either operate normally, or the fail (On or Off). The wiring within these systems is typically the greatest potential for failure, and troubleshooting these system defects is both time consuming and expensive. Intermittent type failures may lead to damaged components, and extreme operator frustration. This type of failure mode is most common in automotive, aircraft, and other industrial or transportation systems. We will focus this new technology on these, with direct current (DC) systems that operate from batteries or other power supplies.

The technology is designed to use the existing power source to predict failures prior to their failed condition or during intermittent defect mode. While these systems are not being utilized to operate the equipment, a series of DC pulses (FIG. 1) are generated to determine system integrity. These system tests are performed for a short period and the results are stored for reference to 'normal' operation. Each successive data stream is analyzed against the normal data to generate a predictive algorithm which can be provided to a central processing unit (CPU) for standard alerts. Safety related tactical shutdown can be initiated should the algorithm reach critical failure mode.

Typical failure modes of oxidation, moisture, faulty connections, internal damage, and external destruction can be determined before the system fails, before the human vision will detect, or before existing diagnostics can provide feedback.

SUMMARY OF INVENTION

The present invention provides a method to predict the life expectancy of DC circuits by monitoring circuit paths and sub branches for degradation.

Past prior art has provided only the means to determine a good circuit or a bad (failed) circuit. These no/no-go methods of testing provide no means to prevent a catastrophic failure or predict terms of life expectancy.

The inventive method of monitoring the condition of the circuit comprises of establishing a known baseline signal for a specific type of circuit (each is somewhat different) and defining these characteristics in terms of the lead and trailing edge angular components (@ zero crossing point), the voltage (amplitude), and the period (time length) of the waveform. Ideally the angular component of the square wave should be vertical, or at 90 degrees to x-axis (FIG. 2). The baseline non-regular square wave that is composed of current, voltage, any harmonic of these, or the combination of these signals which best indicate predictive measurement attributed to the specific type of circuit being monitored. Future wave forms indicate the rate of decay based upon the aggregated angular, amplitude, and period components of the zero-crossing points (FIGS. 3 & 4) when compared to the baseline signal and/or prior waveform of the specific splice under observation. The rate of decay is projected to determine the life expectance of the specific circuit.

The DC pulse that is generated will be specifically tuned for the circuit under test. The DC pulse will be both of positive (V+) and negative (V−) voltage such that they are equal with respect to each other. The durations of these pulses are variable ($T_v$) of time but tuned to the components of the circuit. Once these pulse characteristics are established, they are mapped and stored as 'normal' conditions.

Successive tests utilized the identical pulse characteristics (V+, V−, and Tv) established during 'normal' conditions. These tests are conducted while the system is in non-operation, so as not to affect the system operation and at a predetermined interval based upon manufacturers' recommendations. The successive test pulse characteristics are compared to the "normal" conditions and prior test through the algorithm to determine rate of decay of circuit wiring. The algorithm is designed to predict the failure potential of any circuit, and approximate location of the failure point within the wire harness.

This invention provides the methods and apparatus to provide real-time predictive means to user for practicing cost effective preventive maintenance. The apparatus and inclusive communication network allow for these critical decisions to be transferred to centralized decision point.

DETAILED DESCRIPTION OF THE INVENTION

The present invention provides the apparatus and method to measure each of the critical components of a DC circuit, provide combined attribute investigation, complete Time to Failure TTF predictive analysis, and report to remote centralized logistic system for decision process.

Figure 1:
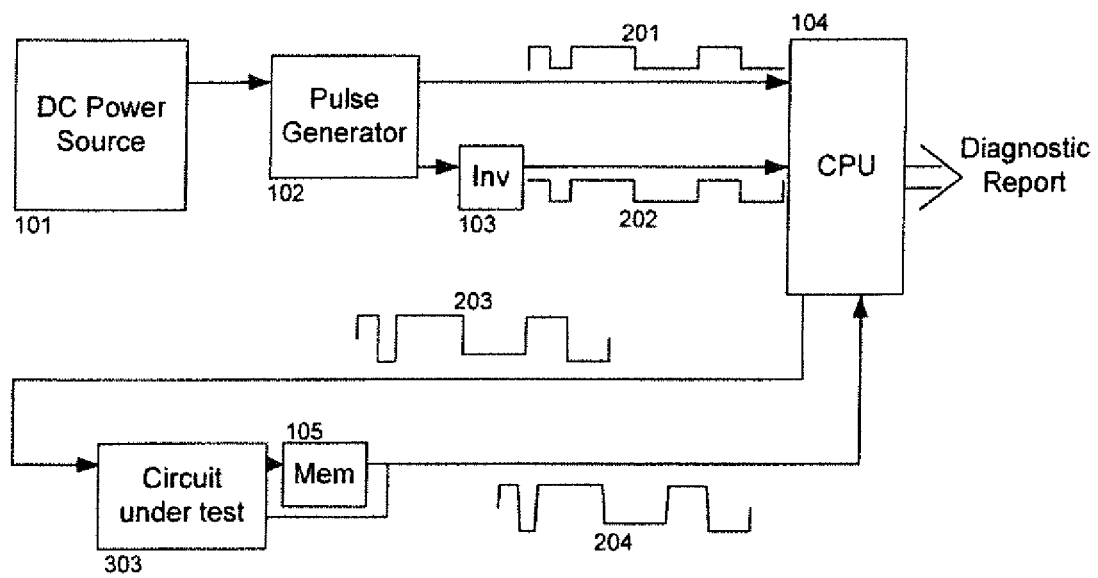
FIG. 1 is a flow chart showing the generation of the DC Pulse Signal and the processing of the voltage potential, current output, and calculated ratios for input to algorithm.

With reference to FIG. 1, a typical DC circuit 303 requires a power source 101 and wiring harness for distribution of power to the various loads within the system. Many of the loads have the memory 105 capabilities 'built-in' as the loads become more advanced. The present invention will generate a DC pulse train 201 through pulse generator 102 and an inverse DC pulse train 202 through invertor 103. A central processing unit (CPU) 104 will marry these DC pulse trains 201, 202 to generate an alternating DC pulse signal 203 specifically for the DC Circuit 303 to generate a decay rate curve (FIG. 5), and predictive action required by decision maker.

A memory storage device 105, either common to load or installed as part of upgrade has the ability to store last DC pulse signal 204 for transmission when the circuit is deactivated along the identical wiring harness used for normal system operation.

In a preferred embodiment, synchronized collection of data of the Positive (V+) Leading edge ($L_1^{@N+}$, $L_2^{@N+}, \ldots, L_{1+y}^{@N+}$), Negative (V−) Leading edge ($L_1^{@N-}$, $L_2^{@N-}, \ldots, L_{1+y}^{@N-}$), Positive (V+) Trailing edge ($T_1^{@N+}$, $T_2^{@N+}, \ldots, T_{1+y}^{@N-}$), Negative (V−) trailing edge ($T_1^{@N-}$, $T_2^{@N-}, \ldots, T_{1+y}^{@N-}$), Positive (V+) voltage ($dV_1^{@N+}$, $dV_2^{@N+}, dV_{1+y}^{@N+}$), Negative (V−) voltage ($dV_1^{@N-}$, $dV_2^{@N-}, dV_{1+y}^{@N-}$); as well as the number of pulses (1+y) and the DC pulse lengths ($T_v1, T_v2, \ldots, T_v(1+y)$) is retained for each specific circuit under review. The CPU 104 processes the information by hardware, firmware, software or a hybrid combination of these methods as described within. The initial alternating DC pulse signal 203 is compared to the latest DC pulse signal 203 by utilizing the data points described above and a customized algorithm for the circuit under review. The above analysis methodology may be completed by purely analog methods, or a combination of analog and digital methods which achieve the same or similar results.

The DC pulse signal 203 can be generated with an external power source. The DC pulse signal 203, 204 is transmitted while the circuit under test 303 is in an idle state so not to effect normal operations. The generate DC pulse train 203 is specifically tuned to the circuit under analysis and considers the specific components, materials, length, and construction of this individual circuit.

Figure 2:
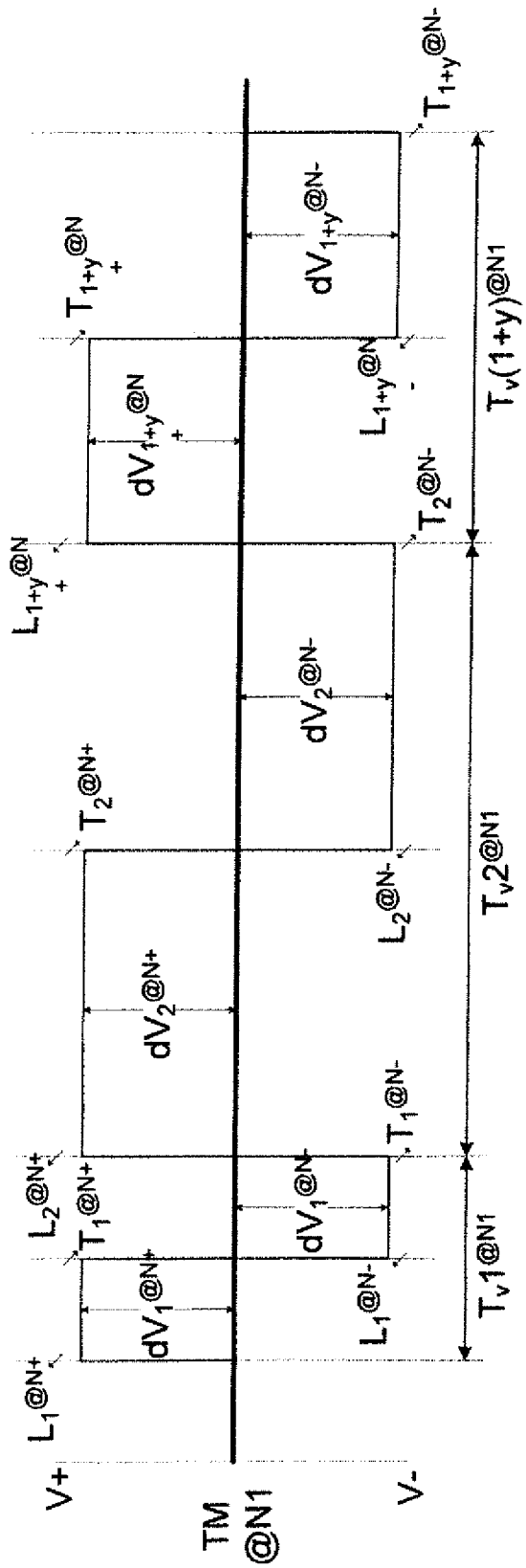
FIG. 2 depicts the generated DC pulse signal with varying amplitudes, period, and duration.
Figure 3:
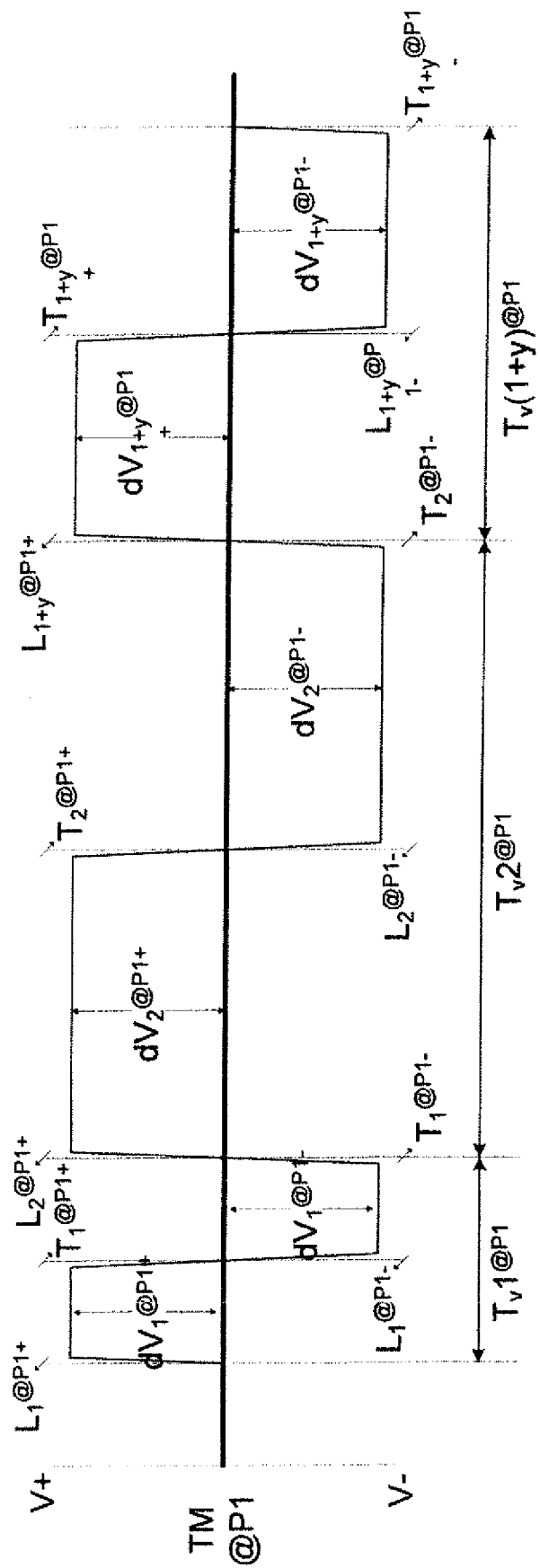
FIG. 3 depicts the generated DC pulse signal with degenerated amplitudes, periods, and durations at some short decay time (P1) after initial circuit integration to system.
Figure 4:
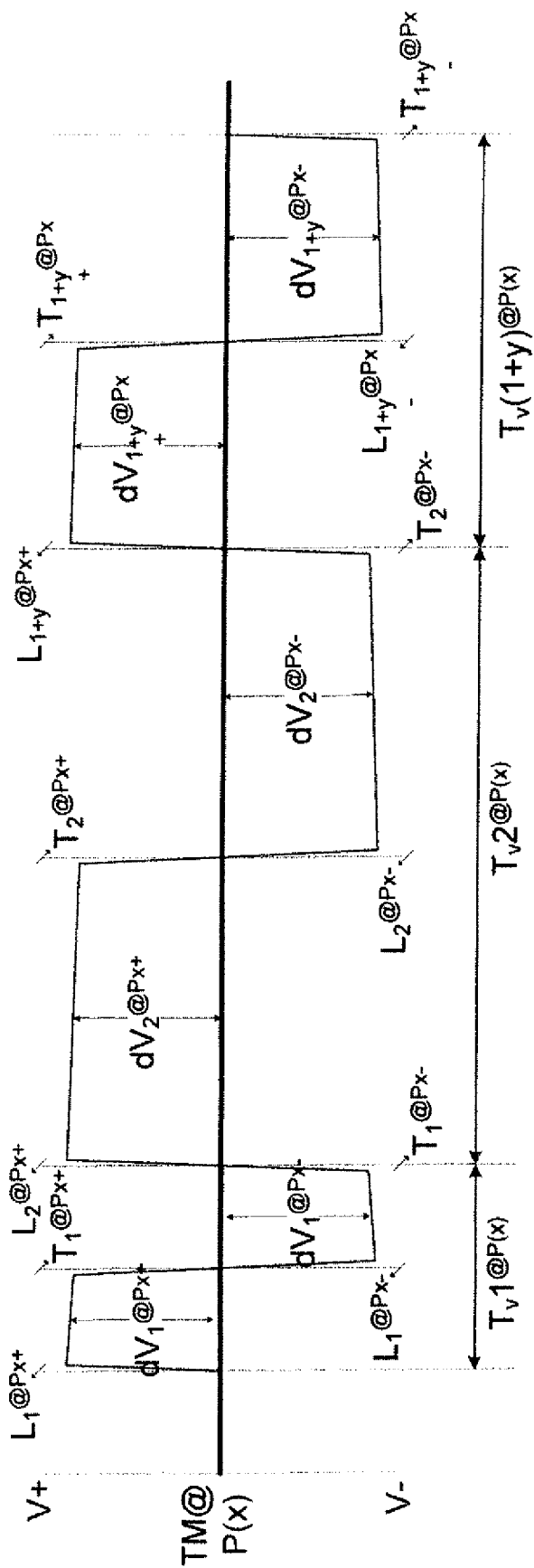
FIG. 4 depicts the generated DC pulse signal with degenerated amplitudes, periods, and durations at some length of decay time ($P_x$) after initial circuit integration to system.

At some time period (P1), these same data points are collected (FIG. 2) and run through an algorithm suitable to determine linear and angular decay of these DC pulses for each of the number of pulses (1+y). At another period P(x) these data points are again logged (FIG. 3) and placed into the algorithm, with the normal data, and the prior data P(x−1) to determine rate of decay. The instantaneous measurements and subsequent analysis can be performed on a variable interval depending on rate of decay of circuit under review. The decay of a circuit is a nonlinear event FIG. 5, meaning the decay rate varies over time.

The decay rate algorithm is based upon the angular component of the Positive (V+) Leading edge ($L_1^{@N+}$, $L_2^{@N+}, \ldots, L_{1+y}^{@N+}$), Negative (V−) Leading edge ($L_1^{@N-}$, $L_2^{@N-}, \ldots, L_{1+y}^{@N-}$), Positive (V+) trailing edge ($T_1^{@N+}$, $T_2^{@N+}, \ldots, T_{1+y}^{@N+}$), Negative (V−) trailing edge ($T_1^{@N-}$, $T_2^{@N-}, \ldots, T_{1+y}^{@N-}$) and Positive (V+) voltage ($dV_1^{@N+}$, $dV_2^{@N+}, dV_{1+y}^{@N+}$), Negative (V−) voltage ($dV_1^{@N-}, dV_2^{@N-}, dV_{1+y}^{@N-}$); as well as the number of pulses (1+y) and the DC pulse lengths ($T_v1, T_v2, \ldots, T_v(1+y)$) ratios calculated each measurement cycle when compared to the original state and previous measurement cycle. The algorithm ratios each of the characteristic data set to eliminate abnormalities associate with the components of the DC circuit under review, as these can produce false-positives in the decay curve analysis.

Typical DC circuit ratios may be reflected as such;

$$\text{EDGE RATIO} = \text{Sine}(T_1^{@N+} - T_1^{@P1+}) - \text{Sine}(L_1^{@N+} - L_1^{@P1+}) + \text{Sine}(T_1^{@N-} - T_1^{@P1-}) - \text{Sine}(L_1^{@N-} - L_1^{@P1-}) + \text{Sine}(T_2^{@N+} - T_2^{@P1+}) - \text{Sine}(L_2^{@N+} - L_2^{@P1+}) + \text{Sine}(T_2^{@N-} - T_2^{@P1-}) - \text{Sine}(L_2^{@N-} - L_2^{@P1-}) + \ldots + \text{Sine}(T_{1+y}^{@N+} - T_{1+y}^{@P1+}) - \text{Sine}(L_{1+y}^{@N+} - L_{1+y}^{@P1+}) + \text{Sine}(T_{1+y}^{@N-} - T_{1+y}^{@P1-}) - \text{Sine}(L_{1+y}^{@N-} - L_{1+y}^{@P1-})$$

$$\text{PERIOD RATIO} = (T_v1^{@N1} - T_v1^{@P(x-1)})/2 + (T_v2^{P(x-1)} - T_v2@^{P(x)})/2 + (T_v2^{@N1} - T_v2^{@P(x-1)})/2 + (T_v2^{P(x-1)} - T_v2@^{P(x)})/2 + \ldots + (T_v(1+y)^{@N1} - T_v(1+y)^{@P(x-1)})/2 + (T_v(1+y)^{P(x-1)} - T_v(1+y)@^{P(x)})/2$$

$$\text{AMPLITUDE RATIO} = (dV_1^{@N+}[L_1^{@N+}] - dV_1^{@N+}[T_1^{@N+}] + dV_1^{@N-}[L_1^{@N-}] - dV_1^{@N-}[T_1^{@N-}])/2 + (dV_2^{@N+}[L_2^{@N+}] - dV_2^{@N+}[T_2^{@N+}] + dV_2^{@N-}[L_2^{@N-}] - dV_2^{@N-}[T_2^{@N-}])/2 + \ldots + (dV_{(1+y)}^{@N+}[L_{(1+y)}^{@N+}] - dV_{(1+y)}^{@N+}[T_{(1+y)}^{@N+}] + dV_{(1+y)}^{@N-}[L_{(1+y)}^{@N-}] - dV_{(1+y)}^{@N-}[T_{(1+y)}^{@N-}])/2$$

Based upon these data ratios, the algorithm can predict the estimated failure point of the circuit. With a typical algorithm weighting the designated ratio after tuning waveform to circuit under review as such;

$$\text{Output}_{(algorithm)} = \text{Edge Ratio} + \text{Period Ratio} \times 1.3 + \text{Amplitude Ratio} \times 0.7$$

Figure 5:
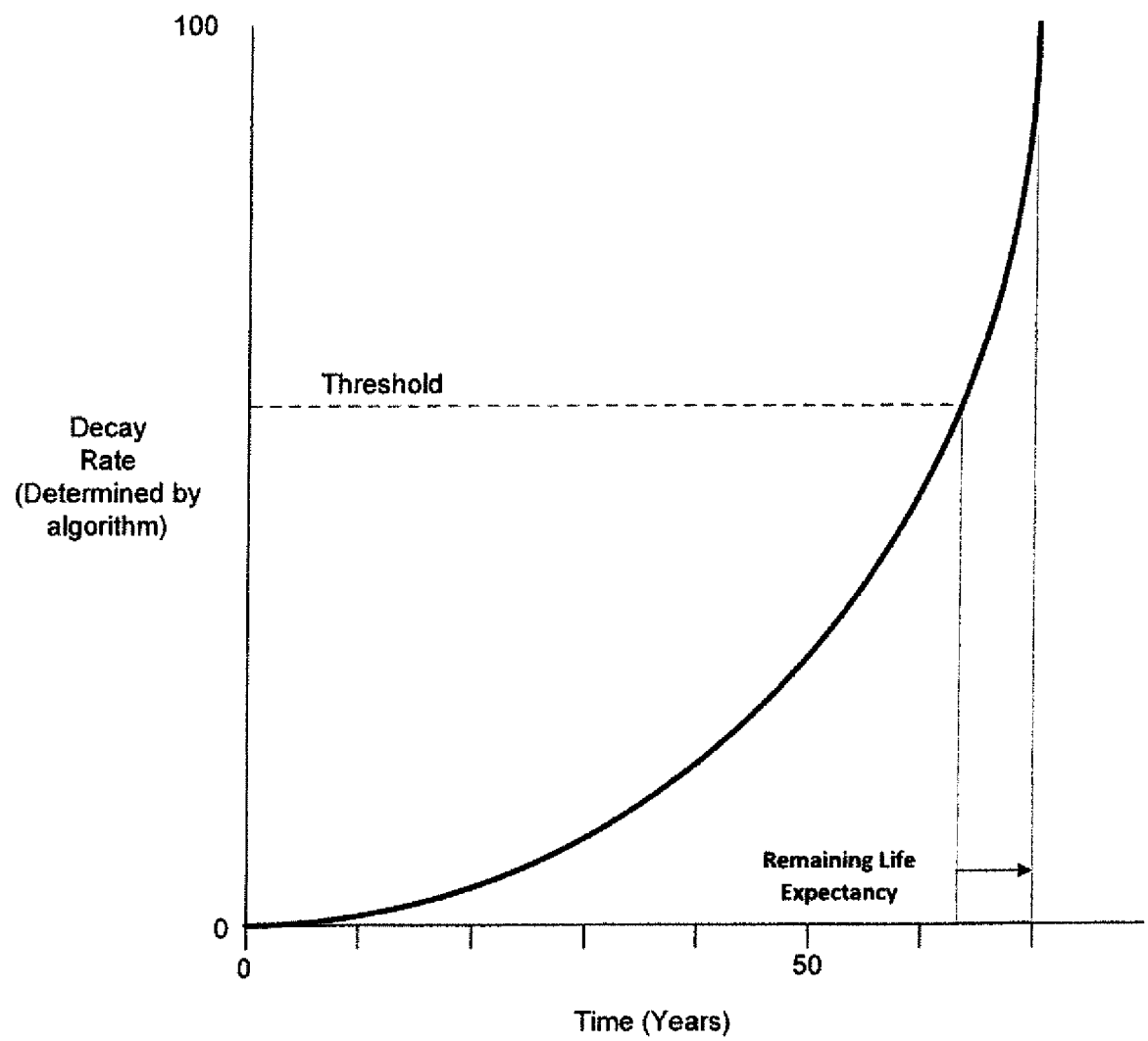
FIG. 5 indicates the decay curve for a circuit.

This allows us to normalize the data to produce a predictive decay curve for analysis as depicted in FIG. 5, specific to the DC circuit under review. Because each circuit has individual uncommon components, each circuit must be designated separately.

Multiple algorithm points can be stored for history purposes and may be useful for technical troubleshooting of system integrity.

Once an appropriate baseline is established for a specific DC circuit, a quantitative threshold may be established in order to compute the life expectance of the circuit under review. This life expectancy may be reestablished based upon future analysis and preventative maintenance actions can be scheduled based upon end of life projections.

As such, an invention has been disclosed in terms of preferred embodiments thereof which fulfills each and every one of the objects of the present invention as set forth above and provides a new and improved method and apparatus for predicting the life cycle of a DC circuit.

Of course, various changes, modifications, and alterations from the teachings of the present invention may be contemplated by those skilled in the art without departing from the intended spirit and scope thereof. It is intended that the present invention only be limited by the terms of the appended claim.

The invention claimed is:

1. A method of predicting a life cycle of a DC circuit comprising:
   a) generating a DC pulse train for a DC circuit, the DC circuit identified to have a life cycle thereof predicted;
   b) establishing a baseline for the DC circuit in terms of amplitude ratio distortions, period ratio fluctuations, duration ratio variations characteristics at a zero crossing point of the generated DC pulse train;
   c) monitoring and determining the corresponding ratios of the DC circuit used in step (a), in a zero point crossing region for the DC circuit that has been in service; and
   d) comparing corresponding ratios of step (a) and step (b) to establish a decay rate analytic curve so that decay rate analytics can be used to establish end of life expectancy and predict estimated time to failure for the DC circuit being monitored.

2. The method of claim 1, such that the DC circuit is stand alone or part of a network of DC circuits within a system.

3. The method of claim 1, wherein for step (d), the decay rate analytic curve indicates a degradation rate of the DC circuit under analysis, and life expectancy of the DC circuit before failure.

4. The method of claim 1 wherein data obtained from step (c) can be utilized to troubleshoot a DC circuit after complete failure.

5. An apparatus adapted for practicing the method of claim 1 comprising
   a) DC power source, if required, to generate required power;
   b) a pulse generator to generate a pulse train;
   c) a pulse invertor to generate a negative pulse train;

d) a central processing unit to generate a pulse wave specific to the DC circuit being monitored;
e) a memory module for storing pulse waves until the pulse waves are transmitted back to the central processing unit; and
f) means for determining ratios and generating an algorithm to produce a decay rate analytical curve, the decay rate analytical curve used to establish end of life expectancy of the DC circuit being monitored for life cycle prediction.

\* \* \* \* \*